(12) United States Patent
Yamano

(10) Patent No.: US 7,937,828 B2
(45) Date of Patent: *May 10, 2011

(54) METHOD OF MANUFACTURING WIRING BOARD

(75) Inventor: Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 1064 days.

This patent is subject to a terminal disclaimer.

(21) Appl. No.: 11/509,684

(22) Filed: Aug. 25, 2006

(65) Prior Publication Data

US 2007/0044303 A1    Mar. 1, 2007

(30) Foreign Application Priority Data

Aug. 26, 2005    (JP) ............................. P.2005-246438

(51) Int. Cl.
    *H05K 3/20*    (2006.01)
(52) U.S. Cl. ............... 29/831; 29/830; 29/843; 29/739; 29/825; 29/846; 174/254; 174/260; 174/261; 174/262
(58) Field of Classification Search ............ 29/830–831, 29/843–845, 739, 75, 23.36, 25.25, 846, 29/825; 174/254, 262, 260, 261
    See application file for complete search history.

(56) References Cited

U.S. PATENT DOCUMENTS

| 6,969,916 | B2 * | 11/2005 | Shizuno | 257/784 |
| 6,974,724 | B2 * | 12/2005 | Hyvonen et al. | 438/107 |
| 7,351,300 | B2 * | 4/2008 | Takayama et al. | 156/239 |
| 2003/0116843 | A1 | 6/2003 | Iijima et al. | |
| 2004/0074088 | A1 * | 4/2004 | Nakamura et al. | 29/831 |
| 2005/0006142 | A1 * | 1/2005 | Ishimaru et al. | 174/262 |
| 2006/0016620 | A1 * | 1/2006 | Miyazaki et al. | 174/262 |
| 2006/0085058 | A1 * | 4/2006 | Rosenthal et al. | 623/1.11 |
| 2006/0134907 | A1 | 6/2006 | Ikeda | |

FOREIGN PATENT DOCUMENTS

| JP | 09-139560 | 5/1997 |
| JP | 2000-323613 | 11/2000 |
| JP | 2002-76637 | 3/2002 |
| JP | 2002-246760 | 8/2002 |
| JP | 2003-197809 | 7/2003 |
| JP | 2004-327624 | 11/2004 |
| WO | WO 2005/004567 A1 | 1/2005 |

OTHER PUBLICATIONS

"Carbon Fiber Reinforced Polymer" (Wikipedia, The Free Encyclopedia, Feb. 1, 2009, p. 1&2.*

* cited by examiner

*Primary Examiner* — Derris H Banks
*Assistant Examiner* — Jeffrey Carley
(74) *Attorney, Agent, or Firm* — Drinker Biddle & Reath LLP

(57) ABSTRACT

A method of manufacturing a wiring board including an insulating layer where a semiconductor chip is embedded includes: forming, on a supporting board, the insulating layer where the semiconductor chip is embedded and a wiring connected to the semiconductor chip; removing the supporting board by etching; and simultaneously forming first and second reinforcing layers so as to sandwich the insulating layer after removing the supporting board.

6 Claims, 17 Drawing Sheets

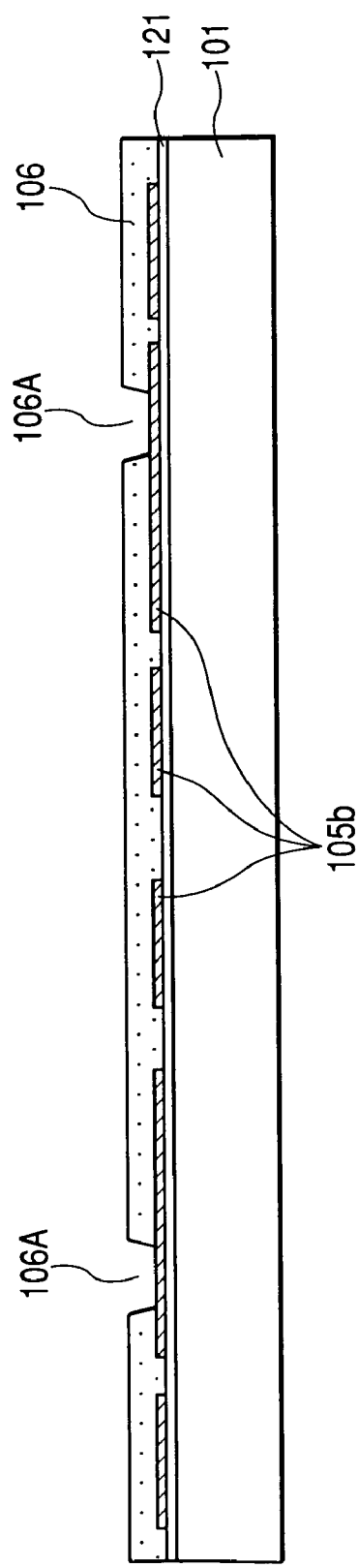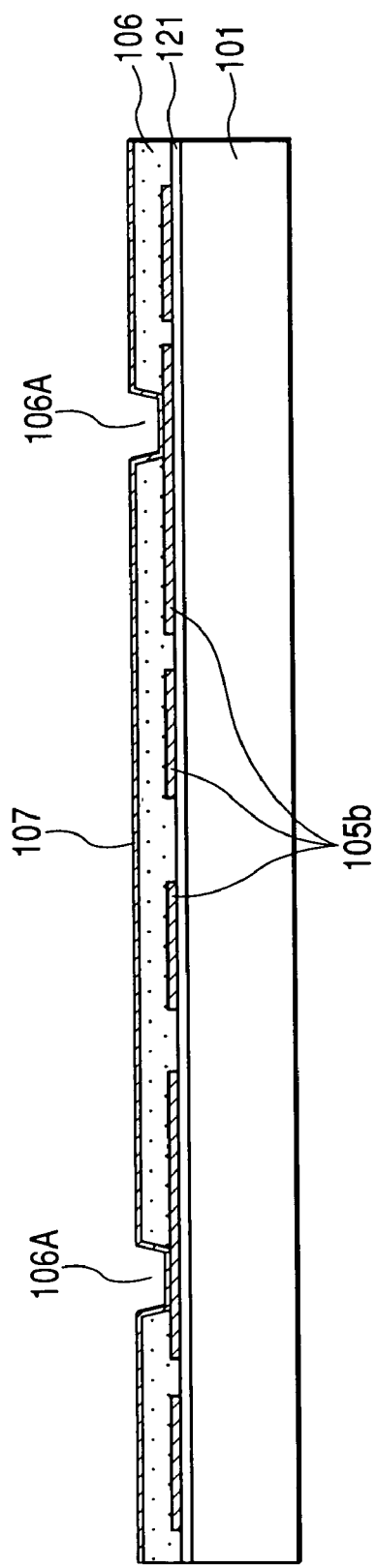

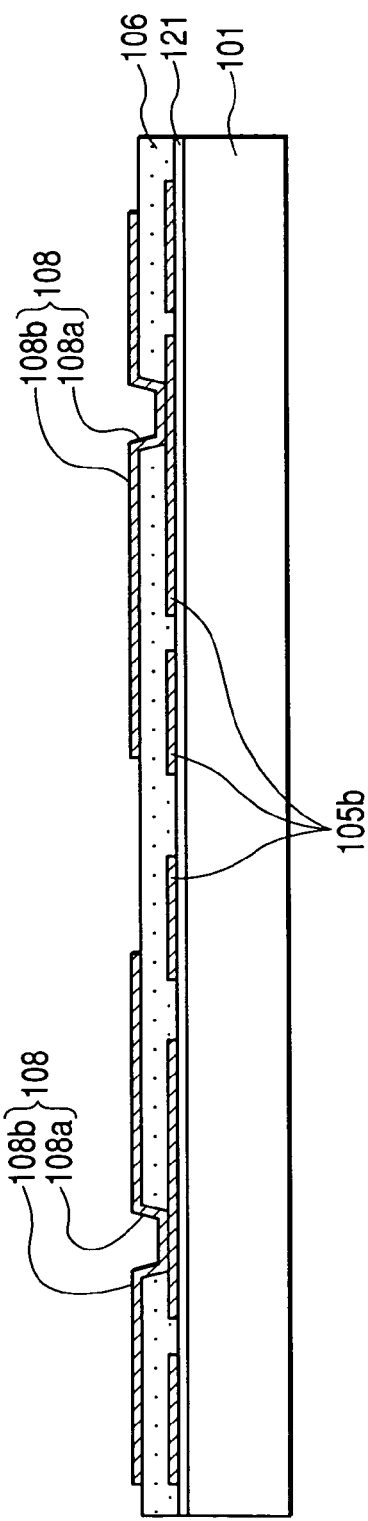
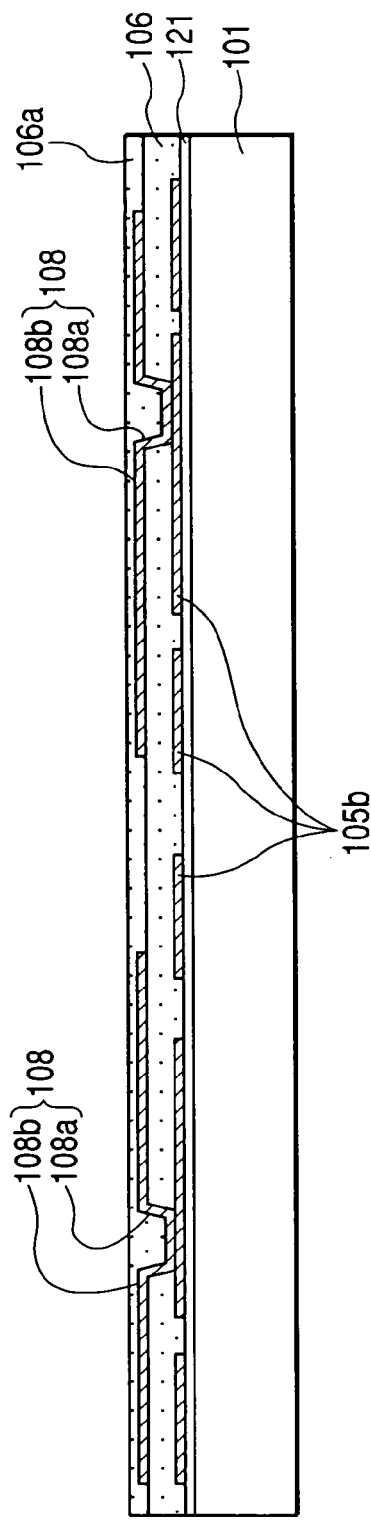

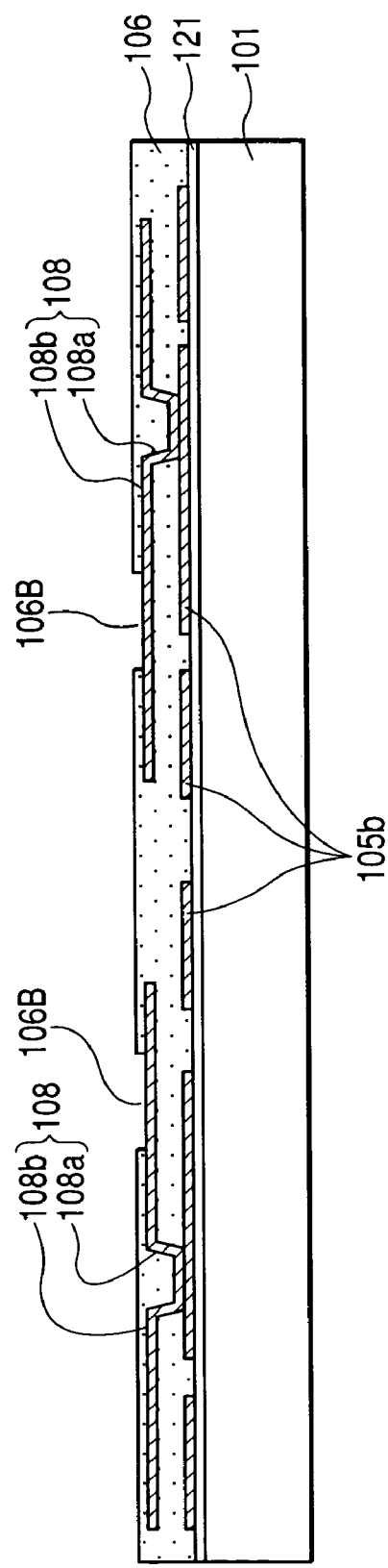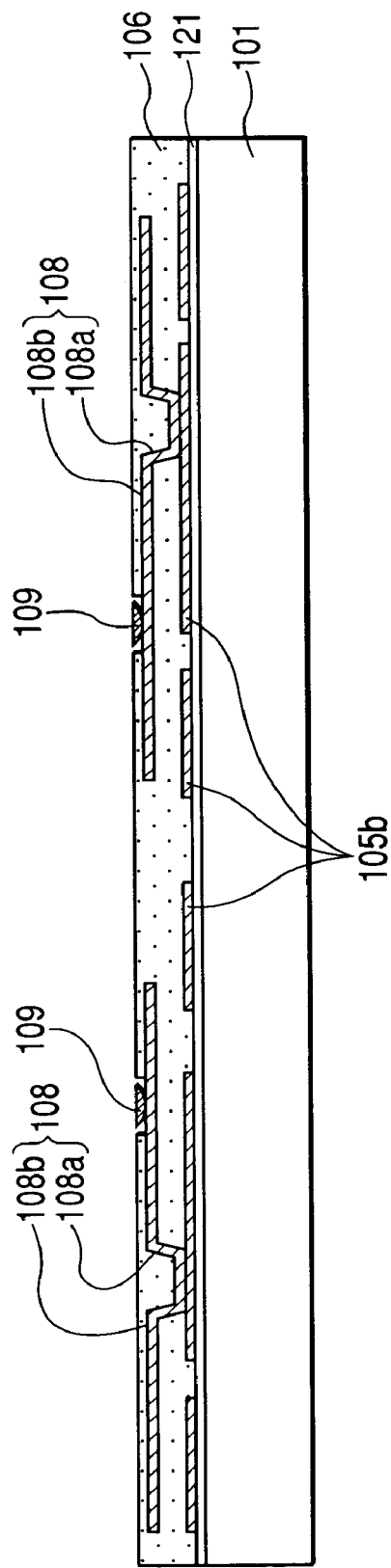

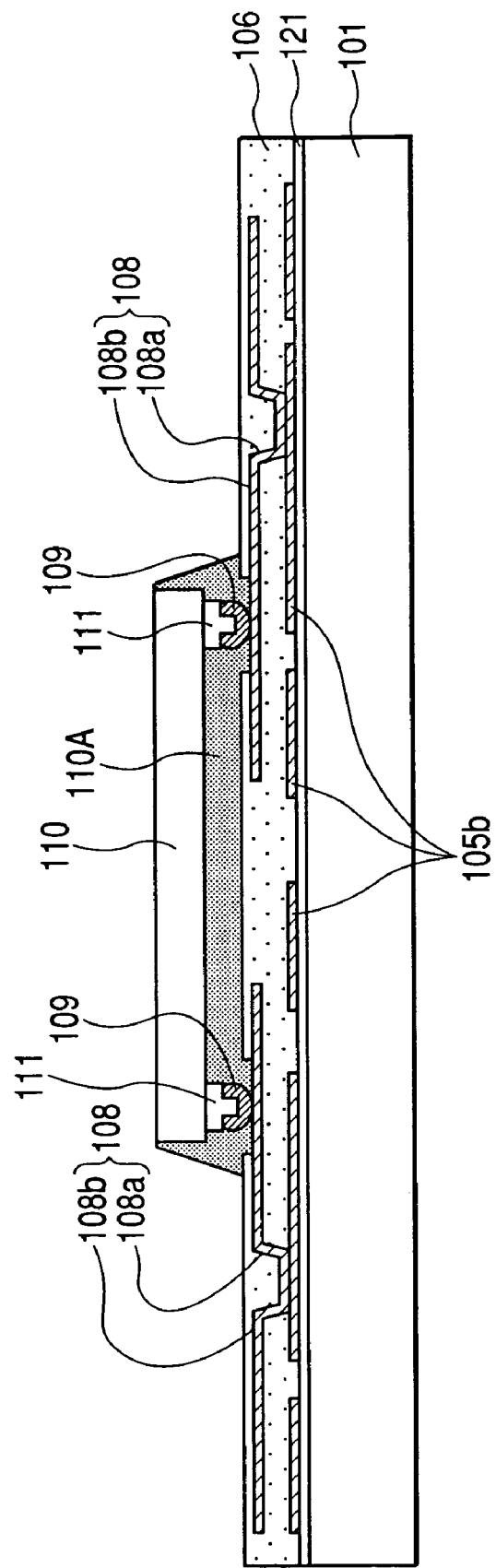

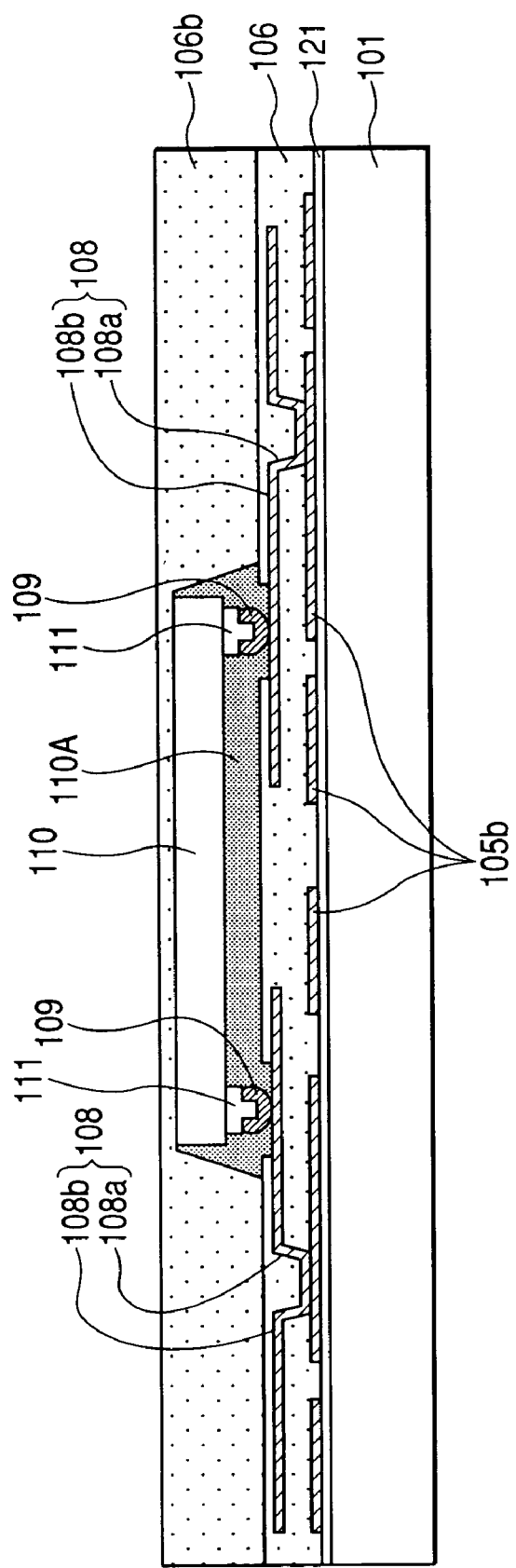

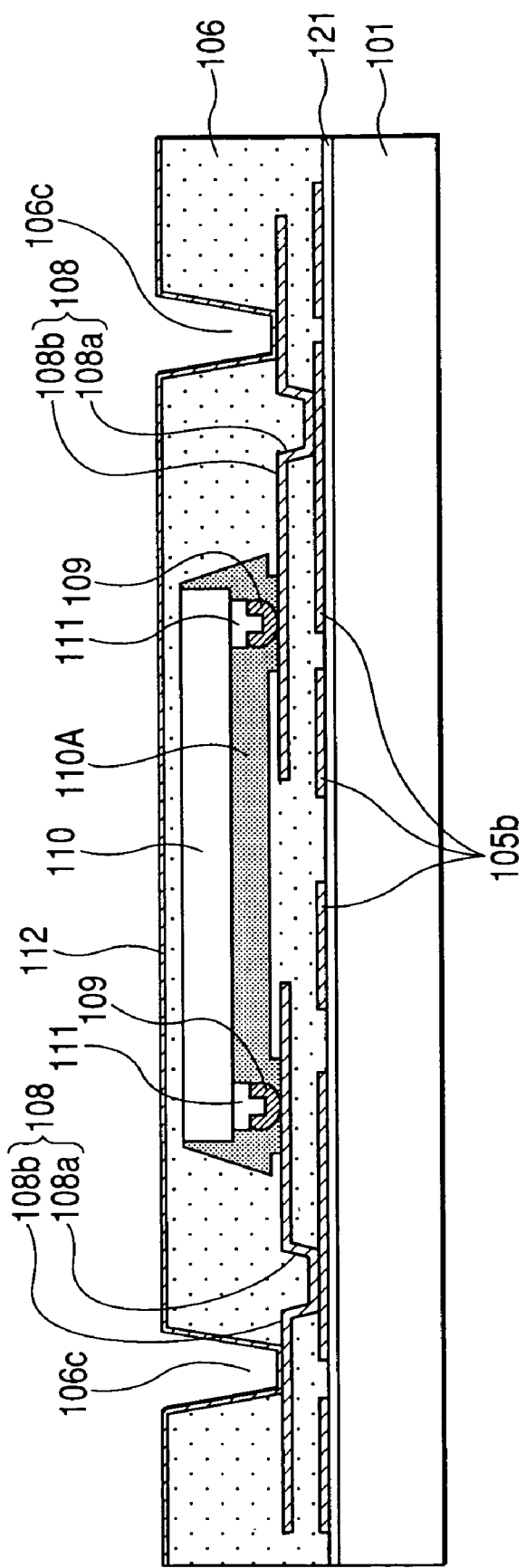

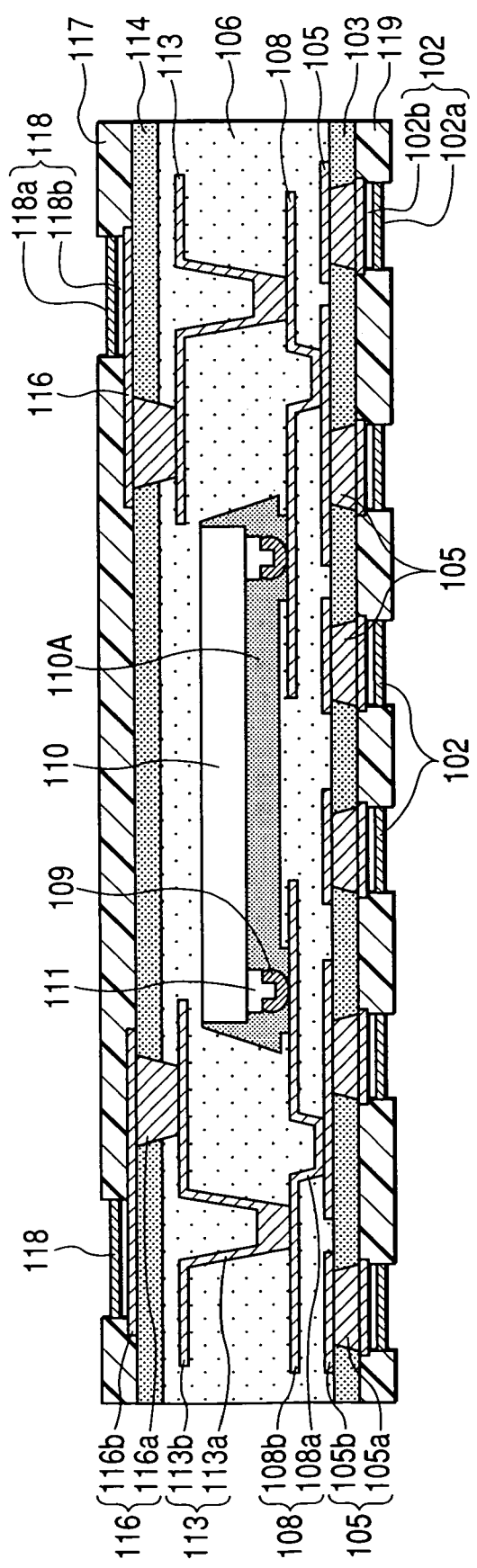

METHOD OF MANUFACTURING WIRING BOARD

This application claims foreign priority based on Japanese Patent application No. 2005-246438, filed Aug. 26, 2005, the content of which is incorporated herein by reference in its entirety.

BACKGROUND OF THE INVENTION

1. Field of the Invention

The present invention relates to a method of manufacturing a wiring board, and in particular to a wiring board in which a semiconductor chip is incorporated.

2. Description of the Related Art

Nowadays, the performance of electronic apparatuses that use semiconductor devices such as semiconductor chips are being advanced, and as a result, there are demands for mounting semiconductor chips on a board at a higher density, and miniaturizing and downsizing the board to which the semiconductor chips are mounted.

Thus, there have been proposed substrates in which semiconductor chips are built, so-called chip built-in wiring boards (for example, refer to JP-A-2004-327624) and various structures designed to build a semiconductor chip in a substrate. Such a chip built-in wiring board has wiring connected to a semiconductor chip and includes a connecting section formed thereon to connect the wiring board to another device, a mother board, etc.

A possible warpage of a wiring board has presented a problem in a case where a chip built-in wiring board with a thinner design and higher packing density is to be provided. To cope with such a warpage, a structure is required where a board such as a core board having a predetermined thickness is laminated on a layer where a semiconductor chip is embedded for effective suppression of warpage. In such a laminated structure, it is difficult to achieve a thinner design and higher density of a wiring board.

SUMMARY OF THE INVENTION

The present invention has been made in view of the above circumstances, and provides a method of manufacturing an innovative and useful wiring board that solves the above problems.

An object of an embodiment of the invention is to achieve a thinner chip-built-in wiring board as well as to suppress warpage of the wiring board.

In some implementations of the invention, a method manufacturing a wiring board comprising:

forming, on a supporting board, an insulating layer in which a semiconductor chip is embedded and a wiring being connected to the semiconductor chip;

removing the supporting board; and forming a first reinforcing layer and a second reinforcing layer simultaneously so as to sandwich the insulating layer after removing the supporting board.

According to the method of the invention, the supporting board is removed after the insulating layer where a semiconductor chip is embedded and the wiring connected to the semiconductor chip are formed, and the first and second reinforcing layers are simultaneously formed so as to sandwich the insulating layer and the like where the supporting board is absent. In general, a reinforcing layer shows large shrinkage on curing. However, since the first and second reinforcing layers are simultaneously formed so as to sandwich the insulating layer, the shrinkage on curing is uniformly applied from above and below the insulating layer, thus preventing an occurrence of warpage.

In the method of manufacturing a wiring board, the reinforcing layer is made of a prepreg material.

According to the method of the invention, a prepreg material is used as a reinforcing layer. This makes it easy to form the reinforcing layer as well as enhance the rigidity of the reinforcing layer.

The method of manufacturing a wiring board comprising:

forming a stop layer on the supporting board before the insulating layer and the wiring are formed on the supporting board, wherein the removal of the supporting board is stopped by the stop layer.

According to the method of the invention, removal of a supporting board is stopped by the stop layer thus preventing removal of the supporting board from having an effect on the layers that are inside of the stop layer. Control of removal processing in removing the supporting board is made easy, and thus the manufacture of a wiring board is simplified.

The method of manufacturing a wiring board comprising:

forming a first solder resist layer and a second solder resist layer simultaneously after forming the first reinforcing layer and the second reinforcing layer, the first solder resist layer being laminated on the first reinforcing layer, and the second solder resist layer being laminated on the second reinforcing layer, wherein an opening is formed at a wiring position in each of the first solder resist layer and the second solder resist layer.

The method of manufacturing a wiring board comprising:

performing surface treatment simultaneously on a first wiring and a second wiring that are exposed from the opening formed in the first solder resist layer and the second solder resist layer respectively, after the first solder resist layer and the second solder resist layer are formed.

According to the method of the invention, it is possible to simultaneously form layers that are formed on and under the insulating layer, thus the manufacturing process is facilitated and time required for manufacture is reduced.

According to the method of the invention, it is possible to provide a thinner chip-built-in wiring board that suppress a warpage in the wiring board.

BRIEF DESCRIPTION OF THE DRAWINGS

FIG. 4 is a drawing (3) that shows, step by step, the method of manufacturing a wiring board according to an embodiment of the invention.

FIG. 5 is a drawing (4) that shows, step by step, the method of manufacturing a wiring board according to an embodiment of the invention.

FIG. 6 is a drawing (5) that shows, step by step, the method of manufacturing a wiring board according to an embodiment of the invention.

FIG. 7 is a drawing (6) that shows, step by step, the method of manufacturing a wiring board according to an embodiment of the invention.

FIG. 8 is a drawing (7) that shows, step by step, the method of manufacturing a wiring board according to an embodiment of the invention.

FIG. 9 is a drawing (8) that shows, step by step, the method of manufacturing a wiring board according to an embodiment of the invention.

FIG. 10 is a drawing (9) that shows, step by step, the method of manufacturing a wiring board according to an embodiment of the invention.

FIG. 11 is a drawing (10) that shows, step by step, the method of manufacturing a wiring board according to an embodiment of the invention.

FIG. 12 is a drawing (11) that shows, step by step, the method of manufacturing a wiring board according to an embodiment of the invention.

FIG. 21 is a drawing (20) that shows, step by step, the method of manufacturing a wiring board according to an embodiment of the invention.

DESCRIPTION OF THE PREFERRED EMBODIMENTS

A preferred embodiment of the invention will be described referring to drawings.

Figure 1:
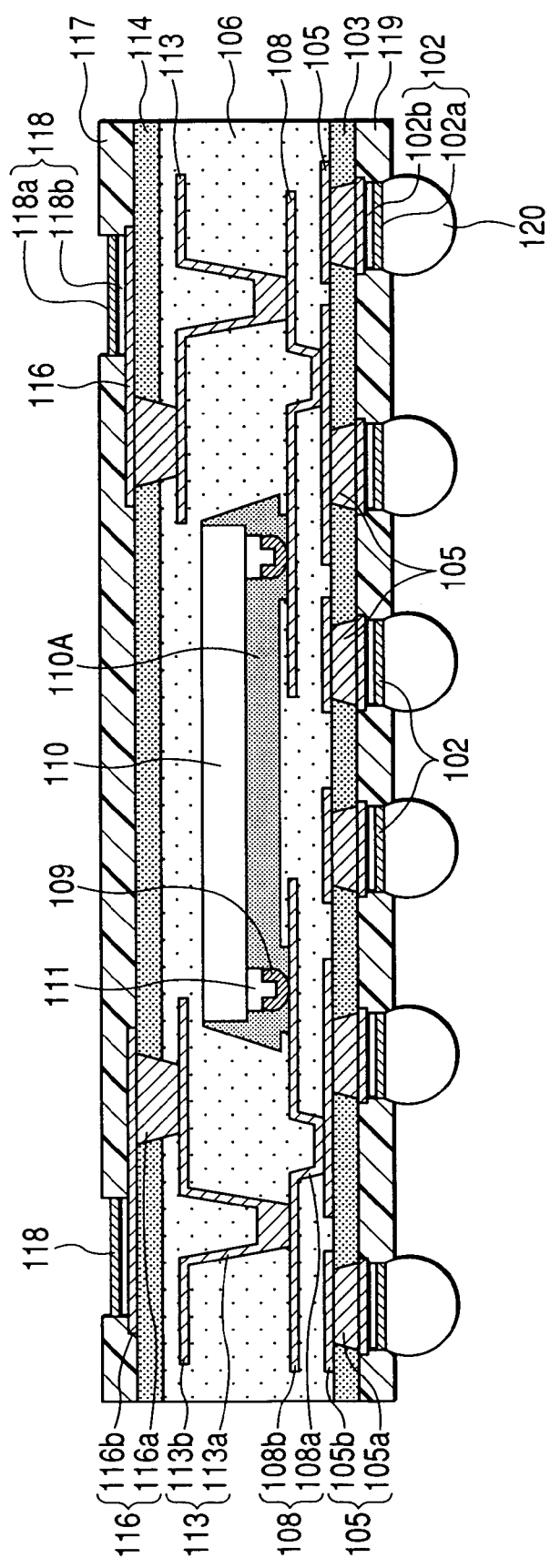
FIG. 1 is a schematic cross-sectional view of a wiring board manufactured by a method of manufacturing a wiring board according to an embodiment of the invention.

FIG. 1 is a schematic cross-sectional view of a wiring board 100 manufactured by a method of manufacturing a wiring board as an embodiment of the invention. For the purpose of explanation, the structure of the wiring board 100 will be described before describing the method of manufacturing the wiring board 100.

As shown in FIG. 1, the wiring board 100 manufactured in this embodiment has an insulating layer 106 including a so-called buildup resin material such as epoxy where a semiconductor chip 110 is embedded. First and second reinforcing layers 103, 114 are formed with respect to the insulating layer 106.

The reinforcing layers 103, 114 are arranged so as to sandwich the insulating layer 106 from top and bottom as shown in the figure. The reinforcing layers 103, 114 are formed using a material having a high rigidity such as a prepreg material. The insulating layer 106 is formed of a buildup resin material that is flexible as mentioned earlier. By providing reinforcing layers 103, 114 to sandwich the insulating layer 106, the insulating layer 106 is reinforced by the reinforcing layers 103, 114.

The semiconductor chip 110 is connected to a wiring section (described later) and is connected to an electrode 102 formed in an opening in a solder resist 119 or an electrode 118 formed in an opening in a solder resist 117 via the wiring section. The electrode 102 or 118 is used for connection to a mother board, another device, or a connecting device, for example.

On the electrode pad (no shown) of the semiconductor chip 110 is formed a stud bump 111 composed of for example Au. The stud bump 111 is connected to a wiring section 108 embedded in the insulating layer 106 via a solder-connecting section 109, for example. Under the semiconductor chip 110 is formed an underfill layer 110A from the viewpoint of protecting the stub bump 111 and suppressing generating of a stress.

The wiring board 100 has wiring sections 105, 113, 116 as well as the wiring section 108. The wiring sections 105, 108, 113, 116 are formed of for example, Cu.

The wiring section 105 includes a via plug 105a and pattern wiring 105b. The via plug 105a is formed at the opening formed in the reinforcing layer 103. On the reinforcing layer 103 is formed pattern wiring 105b connected to the via plug 105a.

The wiring section 108 is formed in the insulating layer 106. The wiring section 108 is formed above the wiring section 105 as shown in the figure. The wiring section 108 includes a via plug 108a formed on the pattern wiring 105b and a pattern wiring 108b connected to the via plug 108a. To the pattern wiring 108b is connected a semiconductor chip 110 via the solder-connecting section 109 and the stud bump 111 as described earlier.

The wiring section 113 is formed in the insulating layer 106. The wiring section 113 is formed above the wiring section 108 as shown in the figure. The wiring section 113 is electrically connected to the wiring section 108. The wiring section 113 includes a via plug 113a formed on the pattern wiring 108b and a pattern wiring 113b connected to the via plug 113a.

The wiring section 116 is formed above the wiring section 113 as shown in the figure. The wiring section 116 is electrically connected to the wiring section 113. The wiring section 116 includes a via plug 116a formed on the pattern wiring 113b and a pattern wiring 116b connected to the via plug 116a. The via plug 116a is formed at the opening formed in the reinforcing layer 114. The pattern wiring 116b is formed above the reinforcing layer 114.

At the opening in solder resist 119 positioned below the insulating layer 106 is formed an electrode 102 connected to the via plug 105a. At the opening of the solder resist 117 positioned above the insulating layer 106 is formed an electrode 118 connected to the pattern wiring 116b. Thus, the wiring board 100 may provide electric connection to the semiconductor chip 110 via the electrodes 102, 118 on top and bottom.

The solder resist layers 119, 117 are formed so as to cover the reinforcing layers 103 and 114. In each solder resist layer 119, 117 is formed an opening for forming the electrode 102, 118. A solder ball 120 is formed as required on the electrode 102. The solder ball 120 may be formed on the electrode 118.

The wiring board 100 thus structured has the insulating layer 106 where the semiconductor chip 110 and the wiring sections 105, 108, 113, 116 are embedded, the insulating layer 106 sandwiched by a pair of reinforcing layers 103, 114. Thus, even when the insulating layer 106 is made of a flexible resin material, the insulating layer 106 is reinforced from both sides by the reinforcing layers 103, 114 with high rigidity, which reduces a warpage in the wiring board 100 and provides the wiring board 100 with high flatness and that can cope with a finely arranged wiring.

For example, the reinforcing layers 103, 114 are preferably formed using a prepreg material. The prepreg material may be used as a material of a core board used to form a multi-layer wiring board (buildup board).

For example, the prepreg material has a structure where glass fibers are impregnated with an epoxy resin and has a higher post-heat-curing rigidity than a general buildup resin material. For example, the elastic modulus (Young's modulus) of a buildup resin material is about 5 GPa to 8 GPa while the elastic modulus of a prepreg material is 20 GPa or above, which shows the high rigidity of the latter that reduces a warpage in a wiring board.

A material used for the reinforcing layers 103, 114 is not limited to a prepreg material but may be a mold resin with high rigidity. A material used for the reinforcing layers 103, 114 may be a metallic material although a structure to insulate the wiring section from the reinforcing layer is preferably added in case a conductive material such as a metal is used. The wiring board 100 according to this embodiment may be formed based on a buildup method that allows a thin design of the wiring board 100.

Next, the method of manufacturing the wiring board will be described step by step referring to FIGS. 2 to 21.

Figure 2:
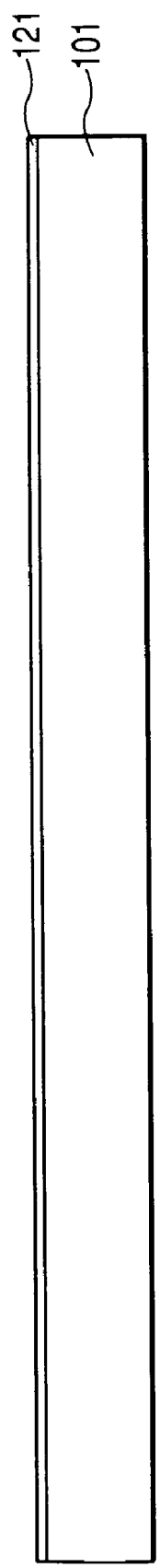
FIG. 2 is a drawing (1) that shows, step by step, the method of manufacturing a wiring board according to an embodiment of the invention.

In the process shown in FIG. 2, a supporting board 101 of 200 micrometers thick, formed of a conducting material such as Cu is provided. A stop layer 121 is formed on the supporting board 101 by the electroplating method. The stop layer 121 is a nickel film 2 to 3 micrometers thick and is formed on the top surface of the supporting board 101 by using the supporting board 101 as an electrode by the electroplating method.

On that occasion, for the electroplating, the supporting board 101 works as an energizing path. The supporting board 101 is preferably a conductive material, or more preferably, a low-resistance material such as Cu.

Figure 3:
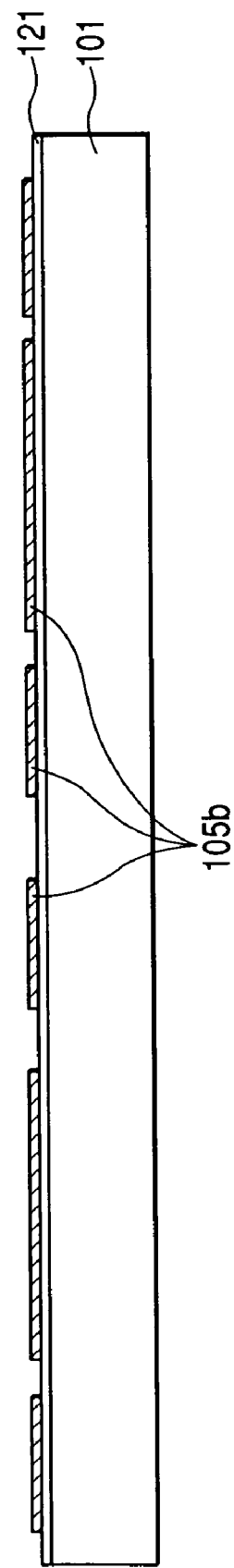
FIG. 3 is a drawing (2) that shows, step by step, the method of manufacturing a wiring board according to an embodiment of the invention.

In the process shown in FIG. 3, pattern wiring 105b is formed on the supporting board 101 where a stop layer 121 is formed. To be more precise, the pattern wiring 105b forms a resist pattern (not shown) by way of photolithography. The resist pattern is used as a mask to deposit Cu by electroplating, and the resist pattern is removed to form the pattern wiring 105b.

Next, in the process shown in FIG. 4, the insulating layer 106 is formed on the supporting board 101 so as to cover the pattern wiring 105b. The insulating layer 106 is made of a buildup material such as a thermosetting epoxy resin. In the insulating layer 106 formed on the supporting board 101 is formed a via hole 106A with laser beams so as to expose part of the pattern wiring 105b.

Next, in the process shown in FIG. 5, desmear process is performed on the surface of the insulating layer 106 as required, and the residue in the via hole is removed and surface treatment made. A seed layer 107 of Cu is formed on the surface of the insulating layer 106 and the exposed pattern wiring 105b by electroless plating.

Next, in the process shown in FIG. 6, the photolithography method is used to form a resist pattern (not shown). Next, the resist pattern is used as a mask to apply electroplating with Cu to form a via plug 108a in the via hole 106A as well as form a pattern wiring 108b integrally connected to the via plug 108a on the insulating layer 106. The via plug 108a and the pattern wiring 108b constitute a wiring section 108. When the wiring section 108 is formed, the resist pattern is stripped and an excessive seed layer 107 exposed is removed by etching.

Next, in the process shown in FIG. 7, an insulating layer 106a is formed on the insulating layer 106 so as to cover the wiring section 108. The insulating layer 106a is a buildup material made of for example a thermosetting epoxy resin, the same material as that of the insulating layer 106. Thus, the insulating layer 106a and the insulating layer 106 are substantially integral. In the process shown in FIG. 7 and afterwards, the insulating layer 106 is assumed to include the insulating layer 106a.

Next, in the process shown in FIG. 8, an opening 106B is formed in the insulating layer 106 by using the laser beam machining method so as to expose part of the wiring section 108 (via plug 108a). Next, the desmear process is applied to the insulating layer 106 as required to remove residue in the opening and perform surface treatment. After that, as shown in FIG. 9, the electroplating method is used to form a solder-connecting section 109 at the opening 106B.

Next, in the process shown in FIG. 10, a process to mount a semiconductor chip 110 on the insulating layer 106 is executed. The semiconductor chip 110 has a stud bump 111 of Au formed thereon in advance. On the semiconductor chip 110, the stud bump 111 and the solder-connecting section 109 are positioned to correspond to each other and are flip-chip connected onto the wiring section 108 (pattern wiring 108b). On that occasion, an underfill layer 110A is formed between the semiconductor chip 110 and the insulating layer 106.

Next, in the process shown in FIG. 11, the insulating layer 106b is formed on the insulating layer 106 so as to cover the semiconductor chip 110. The insulating layer 106b is a buildup material such as a thermosetting epoxy resin. The insulating layer 106b and the insulating layer 106 are substantially integral. In the process shown in FIG. 11 and afterwards, the insulating layer 106 is assumed to include the insulating layer 106b.

Next, in the process shown in FIG. 12, a via hole 106C is formed in the insulating layer 106. The via hole 106C is formed so as to expose the pattern wiring 108b for example by using the laser beam machining method. Next, the desmear process is applied on the surface of the insulating layer 106 as required, thus removing residue in the via hole and performing surface treatment.

Next, on the surface of the insulating layer 106 and on the surface of the pattern wiring 108b is formed a seed layer 112 made of Cu by the electroless plating method. The seed layer 112 is electrically connected to a supporting board 101 made of Cu via the wiring section 108, pattern wiring 105b, and a stop layer 121 made of Ni.

Figure 13:
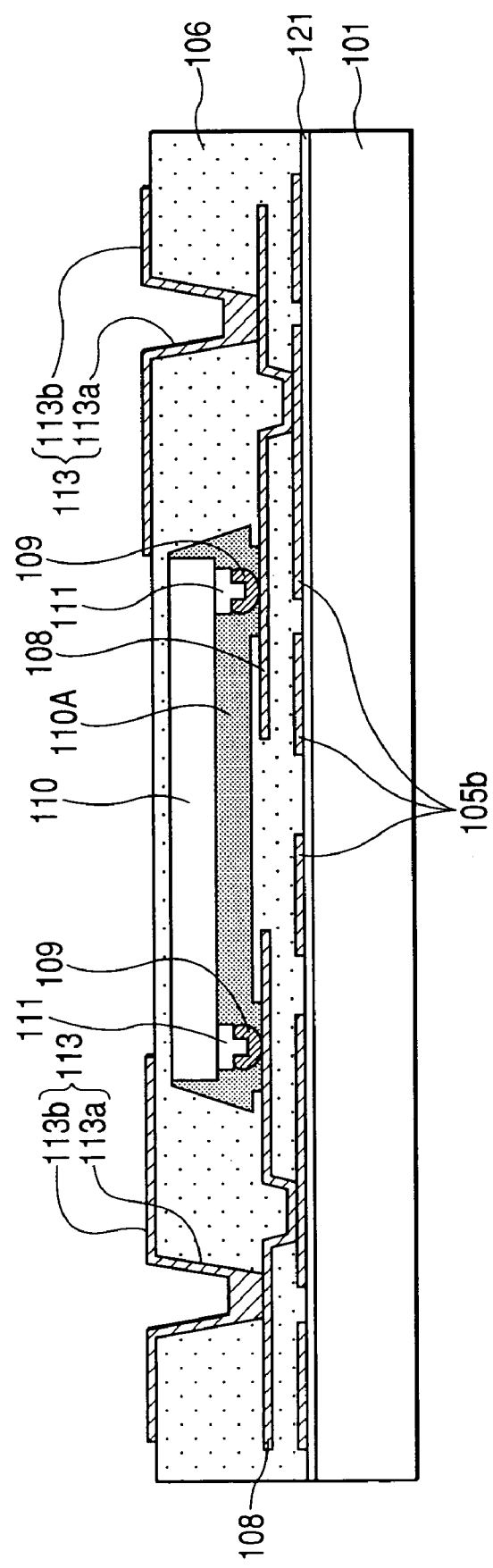
FIG. 13 is a drawing (12) that shows, step by step, the method of manufacturing a wiring board according to an embodiment of the invention.

Next, in the process shown in FIG. 13, the photolithography method is used to form a resist pattern (not shown). Next, the resist pattern is used as a mask to apply electroplating with Cu to form a via plug 113a in the via hole 106C as well as form a pattern wiring 113b connected to the via plug 113a on the insulating layer 106. The via plug 113a and the pattern wiring 113b constitute a wiring section 113. When the wiring section 113 is formed, the resist pattern is stripped and an excessive seed layer exposed is removed by etching.

Figure 14:
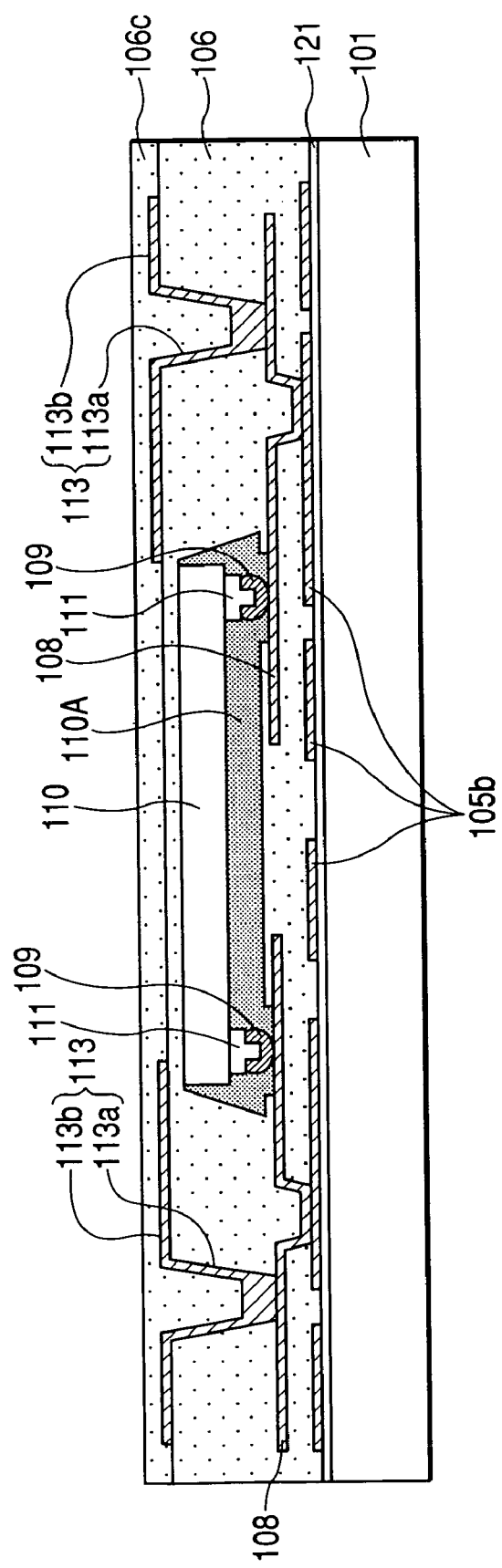
FIG. 14 is a drawing (13) that shows, step by step, the method of manufacturing a wiring board according to an embodiment of the invention.

Next, in the process shown in FIG. 14, an insulating layer (buildup layer) 106c made of for example a thermosetting epoxy resin is formed on the insulating layer 106 so as to cover the wiring section 108. The insulating layer 106c and the insulating layer 106 are substantially integral. In the process shown in FIG. 14 and afterwards, the insulating layer 106 is assumed to include the insulating layer 106c.

In each of the foregoing processes, a process is made to laminate the insulating layer 106, pattern wiring 105b, and wiring sections 108, 113 on the supporting board 101. On that occasion, the insulating layer 106 is made of a resin material with a small elastic modulus and with a dense filler packed therein, which is unlikely to generate a warpage in the layer. Thus, No problematic warpage will take place in the processes show in FIGS. 2 to 14.

Figure 15:
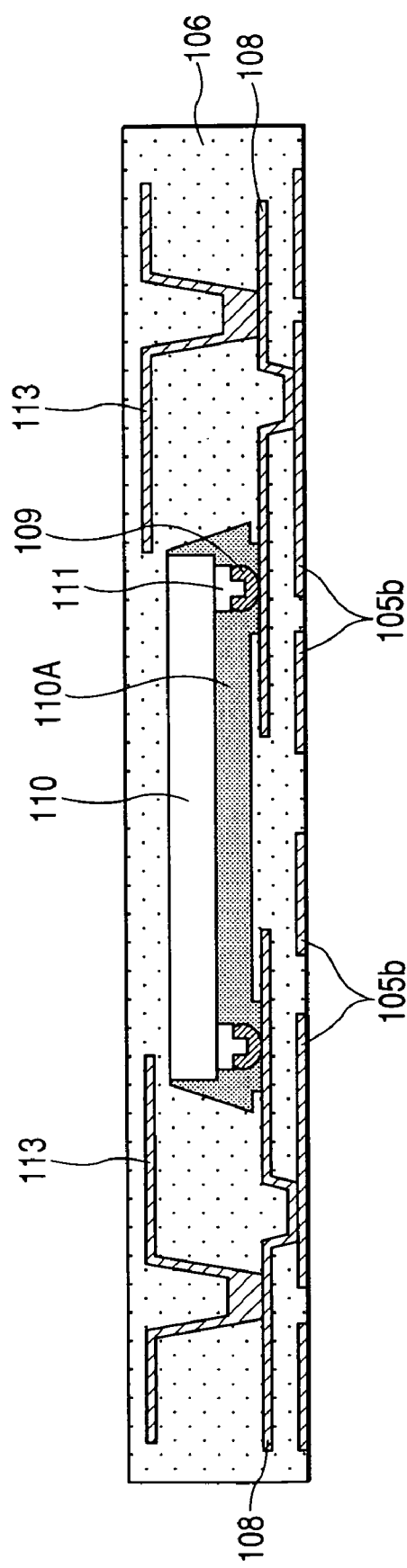
FIG. 15 is a drawing (14) that shows, step by step, the method of manufacturing a wiring board according to an embodiment of the invention.

Next, in the process shown in FIG. 15, the supporting board 101 is removed by etching. The etching liquid used should dissolve the supporting board 101 (Cu) but not Ni of the stop layer 121. This causes the stop layer 121 to stop removal of the supporting board 101, thereby preventing the etching liquid from having an effect on the layers inside the stop layer 121, that is, the insulating layer 106, the pattern wiring 105b, and the wiring sections 108, 113. Management of removal processing in removing the supporting board 101 is made easy thus simplifying the manufacture of the wiring board 100. When removal of the supporting board 101 is complete, the stop layer 121 is removed with an etching liquid that dissolves Ni but does not resolve Cu.

The supporting board 101 is removed, which means that no members support the insulating layer 106. When the supporting board 101 is removed, the insulating layer 106 is about 200 to 300 micrometers thick assuring a rigidity to withstand handling. The absence of the supporting board 101 does not become an obstacle to processes shown in FIG. 16 and after that are described later.

Figure 16:
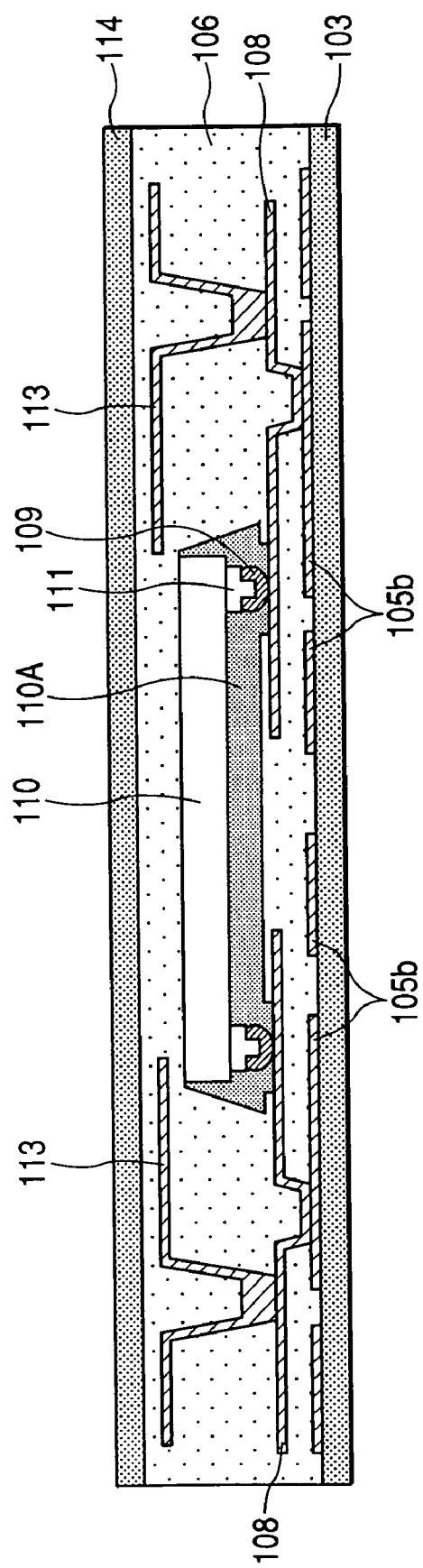
FIG. 16 is a drawing (15) that shows, step by step, the method of manufacturing a wiring board according to an embodiment of the invention.

Next, in the process shown in FIG. 16, a reinforcing layer 103 is formed under the insulating layer 106 and a reinforcing layer 114 is formed at the same time on the insulating layer 106. The insulating layer 106 is sandwiched by the reinforcing layers 103 and 114.

Here, the reinforcing layers 103 and 114 are formed simultaneously. This means that curing of the reinforcing layers 103 and 114 are performed simultaneously so that shrinkage of the reinforcing layers 103 and 114 on curing is uniformly applied from above and below the insulting layer 106, etc., thus preventing a possible warpage of the wiring board. Also, by performing the curing simultaneously, a heat history of the reinforcing layer 103 and a heat history of the reinforcing layer 114 can be identical.

In this case, the reinforcing layers 103 and 114 are pressed and attached temporarily to the insulating layer 106, and then the curing is performed. The reinforcing layers 103 and 114 may be attached to the insulating layer 106 separately, or simultaneously.

The reinforcing layers 103, 114 are formed for example by laminating a prepreg material under heat and pressure. The prepreg material has a structure where glass fibers are impregnated with an epoxy resin as mentioned earlier and has a higher post-heat-curing rigidity than a general buildup resin material. For example, the elastic modulus (Young's modulus) of a buildup resin material is about 5 GPa to 8 GPa while the elastic modulus of a prepreg material is 20 GPa or above, which shows the high rigidity of the latter that reduces a warpage in a wiring board.

Figure 17:
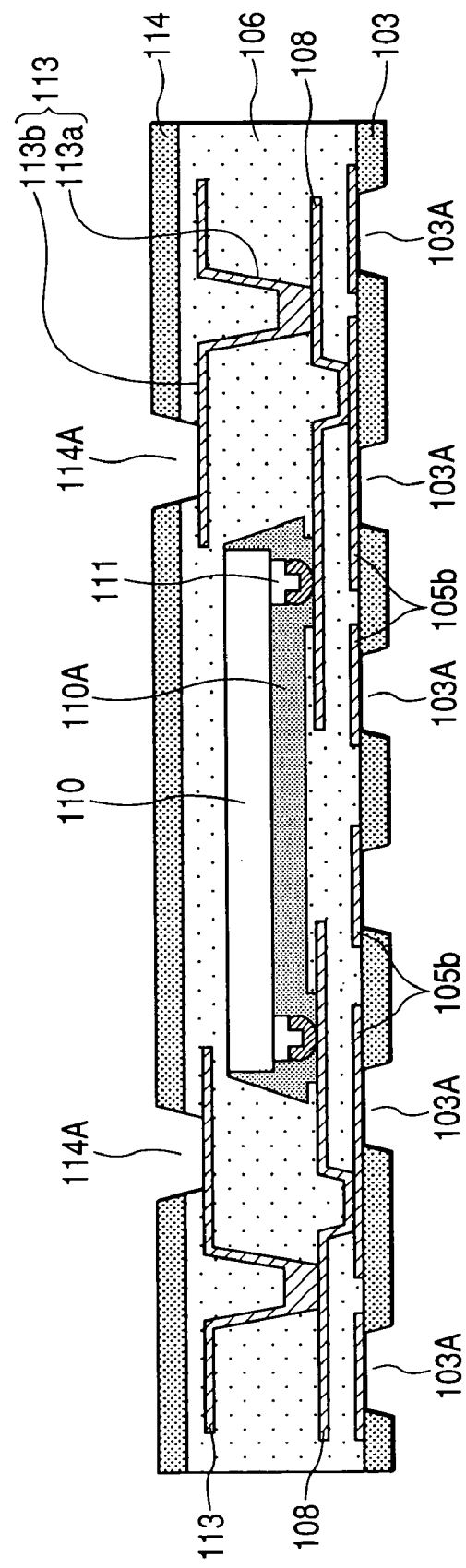
FIG. 17 is a drawing (16) that shows, step by step, the method of manufacturing a wiring board according to an embodiment of the invention.

Next, in the process shown in FIG. 17, a via hole 103A is formed in the reinforcing layer 103 by using laser beams so as to expose pattern wiring 105b. Then, via holes 114A are formed in the reinforcing layer 114 and an insulating layer 106 by using laser beams so as to expose a wiring section 113 (pattern wiring 113b). The via holes 103A and 114A are simultaneously formed.

Figure 18:
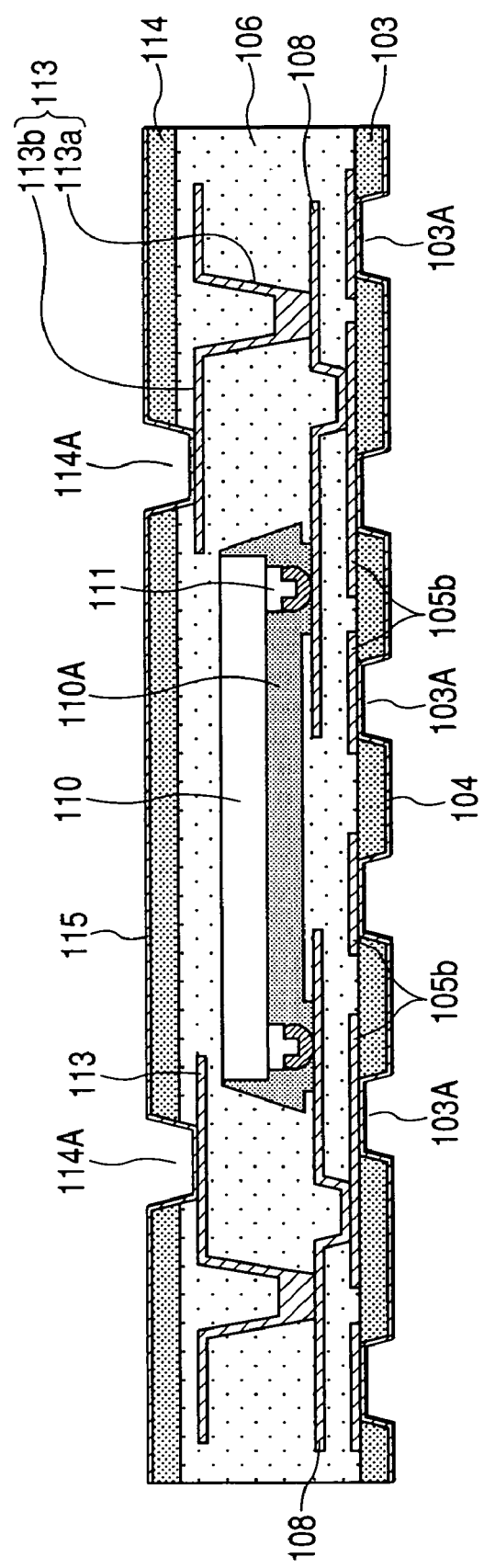
FIG. 18 is a drawing (17) that shows, step by step, the method of manufacturing a wiring board according to an embodiment of the invention.

Next, in the process shown in FIG. 18, the desmear process is applied as required to the bottom surface of the reinforcing layer 103 and the top surface of the reinforcing layer 114 in order to remove residue in the via hole and surface treatment. Then, seed layers 104, 115 of Cu are respectively formed on the bottom surface of the reinforcing layer 103 and the top surface of the reinforcing layer 114 (including part of the insulating layer 106 exposed from the via hole 114A) by the electroless plating method. The seed layers 104, 115 are simultaneously formed.

Figure 19:
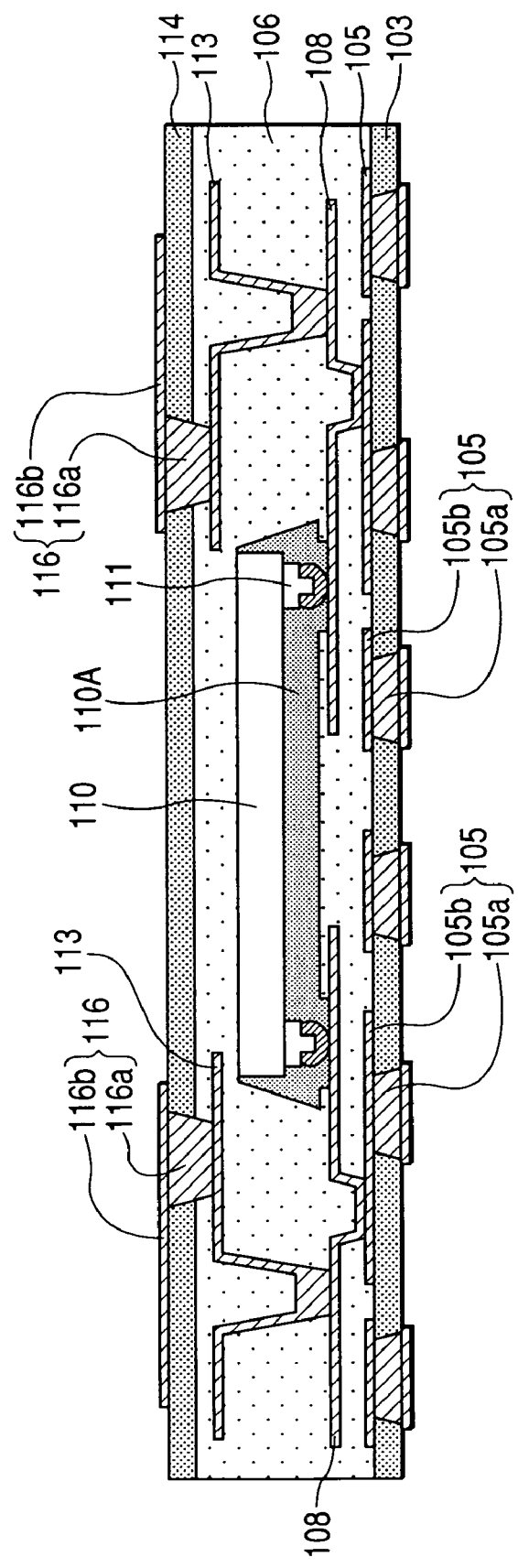
FIG. 19 is a drawing (18) that shows, step by step, the method of manufacturing a wiring board according to an embodiment of the invention.

Next, in the process shown in FIG. 19, the photolithography method is used to form a resist pattern (not shown) in the seed layer 104 and the seed layer 115. Next, the resist pattern is used as a mask to apply electroplating with Cu to form a via plug 105a on the reinforcing layer 103 so as to provide connection to the pattern wiring 105b. The via plug 105a and the pattern wiring 105b constitute a wiring section 105.

At the same time, the resist pattern is used as a mask to form a via plug 116a by electroplating with Cu so as to provide connection to the pattern wiring 113b exposed from the via hole 114A formed in the reinforcing layer 114. On the reinforcing layer 114 is formed pattern wiring 116b to provide connection to the via plug 116a. The via plug 116a and the pattern wiring 116b constitute a wiring section 116.

After the wiring sections 105, 116 are formed, the resist pattern is stripped and the excessive seed layers 104, 115 exposed are removed by etching.

Figure 20:
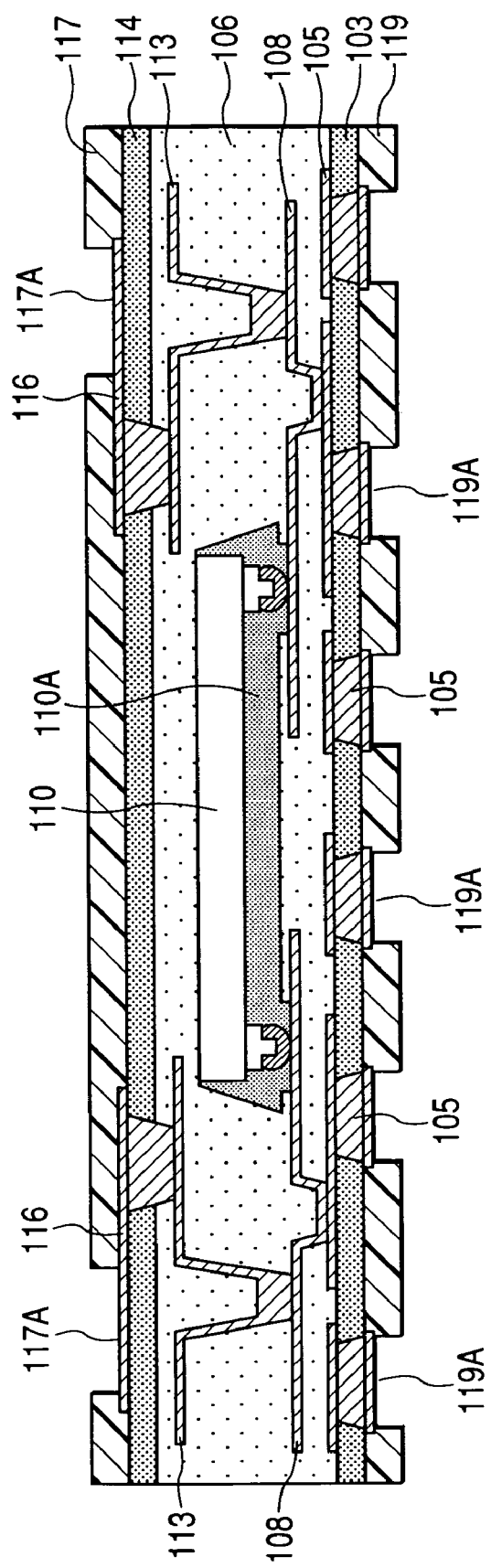
FIG. 20 is a drawing (19) that shows, step by step, the method of manufacturing a wiring board according to an embodiment of the invention.

Next, in the process shown in FIG. 20, a solder resist 119 is formed to cover the reinforcing layer 103 and an opening 119A is formed at a predetermined position where the wiring section 105 (via plug 105a) of the solder resist 119 is exposed. A solder resist 117 is formed so as to cover the reinforcing layer 114. An opening 117A is formed at a predetermined position where the wiring section 116 (pattern wiring 116b) of the solder resist 117 is exposed. The solder resist 117 including the opening 117A and the solder resist 119 including the opening 119A are simultaneously formed.

Next, in the process shown in FIG. 21, an electrode 118 including for example an Au layer 118a and an Ni layer 118b is formed on the wiring section 116 (pattern wiring 116b) exposed from the opening 117A. An electrode 102 including for example an Au layer 102a and an Ni layer 102b is formed on the wiring section 105 (via plug 105a) exposed from the opening 119A (surface treatment). The electrode 102 and the electrode 118 are simultaneously formed.

After that, a solder ball 120 is formed on the electrode 102 to form the wiring board 100 shown in FIG. 1.

The above manufacturing method is a buildup method that uses a coreless structure (structure without a supporting board). This approach provides a thin, compact and lightweight design of a wiring board. Use of the reinforcing layers 103, 114 reduces a warpage in the wiring board. This makes it possible to form a thin wiring board that includes a superfine wiring section.

In this embodiment, the insulating layer 106 where the semiconductor chip 110 is embedded and wiring sections 105, 108, 113 are formed, and then the supporting board 101 is removed. The reinforcing layers 103 and 114 are simultaneously formed to sandwich the insulating layer 106 to which the supporting board 101 is not attached. In general, each of the reinforcing layers 103, 114 show a large shrinkage on curing. The reinforcing layers 103, 114 are simultaneously formed so as to sandwich the insulating layer 106, the wiring section 116, etc. Thus, the shrinkage on curing is uniformly applied from above and below the insulating layer 106, the wiring section 116, etc., thus preventing a possible warpage.

According to this embodiment, in the processes that follows removal of the supporting board 110, to be more specific, in the processes shown in FIGS. 15 to 21, processing on the top surface of the insulating layer 106 and processing on the bottom surface shown in the figure take place simultaneously. In this way, after the supporting board 101 is removed, layers are simultaneously formed on and under the insulating layer 106 thus facilitating the manufacturing process and reducing time required for manufacturing.

While the invention has been described referring to preferable embodiments, the invention is not limited to these specific embodiments but variations and change may be made to the invention without departing from the claims.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of manufacturing a wiring board, the method comprising:

forming a wiring on a supporting board;

disposing a semiconductor chip on the supporting board such that the semiconductor chip is connected to the wiring;

forming an insulating layer on the supporting board such that the semiconductor chip is embedded by the insulating layer;

removing the supporting board; and forming a first reinforcing layer and a second reinforcing layer simultaneously so as to sandwich the insulating layer after removing the supporting board;

forming a first solder resist layer and a second solder resist layer simultaneously after forming the first reinforcing layer and the second reinforcing layer, the first solder resist layer being laminated on the first reinforcing layer, and the second solder resist layer being laminated on the second reinforcing layer, wherein an opening is formed at a wiring position in each of the first solder resist layer and the second solder resist layer.

2. The method of manufacturing a wiring board according to claim 1, wherein at least one of the first reinforcing layer and the second reinforcing layer is made of a prepreg material.

3. The method of manufacturing a wiring board according to claim 1, the method comprising: forming a stop layer on the supporting board before the insulating layer and the wiring are formed on the supporting board, wherein the removal of the supporting board is stopped by the stop layer.

4. The method of manufacturing a wiring board according to claim 1, the method comprising:

performing surface treatment simultaneously on a first wiring and a second wiring that are exposed from the opening formed in the first solder resist layer and the second solder resist layer respectively, after the first solder resist layer and the second solder resist layer are formed.

5. The method of manufacturing a wiring board according to claim 1, wherein the removing step completely removes the supporting board.

6. The method of manufacturing a wiring board according to claim 1, wherein the first reinforcing layer and the second reinforcing layer are formed directly on the insulating layer.

* * * * *